(12) United States Patent  
Yamada

(10) Patent No.: US 8,183,750 B2  
(45) Date of Patent: May 22, 2012

(54) RESONATOR, CONDUCTIVE FILM LAYER AND OSCILLATOR

(75) Inventor: Akinori Yamada, Ina (JP)

(73) Assignee: Seiko Epson Corporation, Tokyo (JP)

( * ) Notice: Subject to any disclaimer, the term of this patent is extended or adjusted under 35 U.S.C. 154(b) by 168 days.

(21) Appl. No.: 12/713,922

(22) Filed: Feb. 26, 2010

(65) Prior Publication Data

US 2010/0219898 A1 Sep. 2, 2010

(30) Foreign Application Priority Data

Mar. 2, 2009 (JP) .................................. 2009-047641

(51) Int. Cl.
*H03H 9/19* (2006.01)
(52) U.S. Cl. ....................................................... 310/370
(58) Field of Classification Search .................... 310/370
See application file for complete search history.

(56) References Cited

U.S. PATENT DOCUMENTS

| | | | | |
|---|---|---|---|---|
| 4,176,030 A * | 11/1979 | Negita | ...................... | 204/192.15 |
| 4,302,694 A * | 11/1981 | Fujishima et al. | ............ | 310/321 |
| 5,987,987 A * | 11/1999 | Watarai | ....................... | 73/504.16 |
| 6,661,162 B1 * | 12/2003 | Nagai et al. | .................... | 310/340 |
| 7,518,291 B2 * | 4/2009 | Tanaya | ............................ | 310/348 |
| 2004/0263027 A1 | 12/2004 | Kawashima | | |
| 2009/0289531 A1* | 11/2009 | Fang et al. | ..................... | 310/370 |

FOREIGN PATENT DOCUMENTS

| | | |
|---|---|---|
| JP | U-2-32229 | 2/1990 |
| JP | A-2005-39767 | 2/2005 |

OTHER PUBLICATIONS

Zener, C., "Internal Friction in Solids I. Theory of Internal Friction in Reeds," *Physical Review*, Aug. 1, 1937, pp. 230-235, vol. 52.
Zener, C., "Internal Friction in Solids II. General Theory of Thermoelastic Internal Friction," *Physical Review*, Jan. 1, 1938, pp. 90-99, vol. 53.
Zener, C., "Internal Friction in Solids III. Experimental Demonstration of Thermoclastic Internal Friction," *Physical Review*, Jan. 1, 1938, pp. 100-101, vol. 53.
Itoh, H. et al., "Analysis of Q-value of a quartz-crystal tuning-fork using thermoelastic equations," $36^{th}$ *EM Symposium*, May 17, 2007, pp. 5-8 (with translation).
Itoh, H. et al., "Analysis of Q-Value of Quartz Crystal Tuning Fork Using Thermoelastic Coupling Equations," *Japanese Journal of Applied Physics*, Jul. 21, 2009, vol. 48.
Roszhart, T. et al., "The Effect of Thermoelastic Internal Friction on the Q of Micromachined Silicon Resonators," *Solid-State Sensor Actuator Workshop, Technical Digest IEEE*, Jan. 4, 1990, USA.

* cited by examiner

*Primary Examiner* — Jaydi San Martin
(74) *Attorney, Agent, or Firm* — Oliff & Berridge, PLC

(57) ABSTRACT

A resonator element includes: a resonating body having a first region and a second region, the first region receiving a compression stress or an extension stress by a vibration, the second region receiving an extension stress responding to the compression stress in the first region, or a compression stress responding to the extension stress of the first region; and at least one film layer, on a surface of the resonating body between the first and the second regions, having thermal conductivity higher than thermal conductivity of the resonating body. In the element, the film layer includes a recessed section in which at least one film layer is removed between the first and the second regions.

4 Claims, 7 Drawing Sheets

RESONATOR, CONDUCTIVE FILM LAYER AND OSCILLATOR

BACKGROUND

1. Technical Field

The present invention relates to prevent a lowering of Q value due to thermal conduction, particularly of a resonator element and an oscillator.

2. Related Art

Tuning fork type piezoelectric resonator elements have been widely used. In such tuning fork type piezoelectric resonator element, a pair of resonating arms vibrates to be closer to each other and apart from each other. Vibration energy losses generated in the flexural vibration of the tuning fork type resonator element cause a resonator to deteriorate the performances. For example, an increase of a CI (crystal impedance) value or a decrease of a Q value occurs. Thermal conduction is considered as one factor of the vibration energy losses.

FIG. 7 is an explanatory view of the thermal conduction of a piezoelectric resonator element. As shown in FIG. 7, a piezoelectric resonator element 1 includes two resonating arms 3 and 4 extending from a connecting section 2 in parallel. When a predetermined voltage is applied to exciting electrodes (not shown) in this state, the resonating arms 3 and 4 vibrate. In a vibration state in which the resonating arms 3 and 4 vibrate to be apart from each other, a compression stress is applied around root portions shown as shaded regions A at the outsides of the resonating arms 3 and 4. In contrast, an extension stress is applied around root portions shown as shaded regions B at the inner sides of the resonating arms 3 and 4.

In a vibration state in which the resonating arms 3 and 4 vibrate to be closer to each other, an extension stress is applied to the shaded regions A while a compression stress is applied to the shaded regions B. In the regions to which the compression stress is applied, the temperature increases while in the regions to which the extension stress is applied, the temperature decreases. The thermal conduction generated between the compression portions receiving the compression stress and the extension portions receiving the extension stress of the resonating arms that vibrate in a flexural mode causes the vibration energy losses. Lowering of the Q value caused by the thermal conduction is called a thermoelastic loss.

In order to prevent or suppress the lowering of the Q value due to the thermoelastic loss, a tuning fork type resonator is disclosed that includes vibrating arms each having a rectangular section and a groove or a hole formed on the centerline thereof, in JP-UM-A-2-32229, for example.

The JP-UM-A-2-32229 describes that the Q value, which shows the thermoelastic loss, becomes minimum at $fm = 1/2\pi\tau$ where fm is a relaxation frequency, and $\tau$ is a relaxation time, in a resonator vibrating in a flexural mode. This is derived from a stress-strain relation equation that is well known in a case of internal friction, which is generally caused by temperature difference, of a solid. The relation of the Q value and the frequency is generally shown as a curve F in FIG. 8. In the figure, a frequency at which the Q value is a minimum Q0 is a thermal relaxation frequency $f0 (= 1/2\pi\tau)$. A region of higher frequency (1<f/f0) is referred to as an adiabatic region while a region of lower frequency (f/f0<1) is referred to as an isothermal region where "f/f0=1" is a reference point.

Incidentally, a flexural resonator element is disclosed, for example, in JP-A-2005-39767 as a tuning fork type flexural resonator having a frequency of a fundamental mode vibration with high frequency stability, and a high Q value. FIGS. 9A and 9B show schematic structures of the flexural resonator element in related art. FIG. 9A is a plan view. FIG. 9B is a cross sectional view taken along the line A-A of FIG. 9A. A flexural resonator element 100 includes tuning fork arms 102 and a tuning fork arm base section 104. The tuning fork arm 102 has grooves 106 at the upper and lower surfaces. Electrodes 110 and 112 are provided to the side surfaces of the grooves 106. Electrodes 114 and 116 having different polarities are provided to the side surfaces of the tuning fork arms 102. The electrodes provided the side surfaces of the grooves are faced to each other with the piezoelectric body interposed therebetween, and likewise the electrodes provided to the side surfaces of the tuning fork arms are faced to each other with the piezoelectric body interposed therebetween.

In the structure disclosed in the JP-A-2005-39767, a heat transfer path between a compression region and an extension region of the tuning fork arms 102 is narrowed by the grooves 106 on the way as shown in FIG. 9B. As a result, a relaxation time $\tau$, which is a period during which the temperatures of the compression region and the extension region come to an equilibrium state, lengthens. As can be seen in an adiabatic region of FIG. 8, the curve F is shifted to a position of a curve F1 in a lower frequency side as a result of forming the grooves 106. In this shift, the relaxation frequency is lowered and the shape of the curve F is not changed. Accordingly, the Q value increases as shown with an arrow "a". On the other hand, the curve F is shifted to a position of a curve F2 when electrodes are formed. The Q value decreases as shown with an arrow "b". The reason of the shift can be considered that the electrodes form a heat transfer path. A material having conductive property, such as an electrode material, has large thermal conductivity. In the conductive material, thermal energy is carried by electrons in addition to phonons of metal. As shown in FIG. 9B, thermal conduction is achieved through the electrodes in addition to the material, i.e., quartz crystal, shortening the relaxation time $\tau$ to increase the relaxation frequency. As a result, it can be considered that the curve F is shifted to the position of the curve F2 in a higher frequency side.

SUMMARY

An advantage of the invention is to provide a resonator element that can prevent the lowering of a Q value due to thermal conduction, and an oscillator in which the resonator element is mounted.

The present invention is intended to solve at least part of the mentioned problems and can be implemented by the following aspects of the invention.

According to a first aspect of the invention, a resonator element includes a resonating body having a first region and a second region, the first region receiving a compression stress or an extension stress by a vibration, the second region receiving an extension stress responding to the compression stress in the first region, or a compression stress responding to the extension stress of the first region; and at least one film layer, on a surface of the resonating body between the first and the second regions, having thermal conductivity higher than thermal conductivity of the resonating body. The film layer includes a recessed section in which at least one film layer is removed between the first and the second regions.

In the resonator element, a part of the film formed on the surface of the resonating body is removed between the first and the second regions both of which alternately receive the compression stress and the extension stress when the resonator element vibrates. The heat transfer path between the compression region and the extension region is, thus, restricted, lengthening the relaxation time. As a result, the relaxation frequency is lowered. This lowering of the relaxation frequency enables the lowering of the Q value due to the thermal conduction to be prevented, attaining a high Q value.

The resonating body may include a groove section having the recessed section.

The formation of the groove section lengthens the relaxation time, which is a period during which the temperatures of the compression region and the extension region come to an equilibrium state. As a result, the relaxation frequency is lowered. This lowering of the relaxation frequency enables the lowering of the Q value due to the thermal conduction to be prevented, attaining a high Q value.

The resonating body may vibrate in a flexural vibration mode.

As a result, the lowering of the Q value due to thermal conduction associated with the compression and extension stresses caused by the flexural vibration can be prevented, attaining a high Q value.

According to a second aspect of the invention, an oscillator includes the resonator element of the first aspect.

As a result, the oscillator can be provided that includes the resonator element described above and prevents the lowering of the Q value due to the thermal conduction.

BRIEF DESCRIPTION OF THE DRAWINGS

The invention will be described with reference to the accompanying drawings, wherein like numbers reference like elements.

FIG. 5A shows that recessed sections are each provided to the upper layer of the first exciting electrode.

FIG. 5B shows that recessed sections are provided in each of which the upper and the lower layers of the first exciting electrode is removed.

DESCRIPTION OF EXEMPLARY EMBODIMENTS

Figure 1:
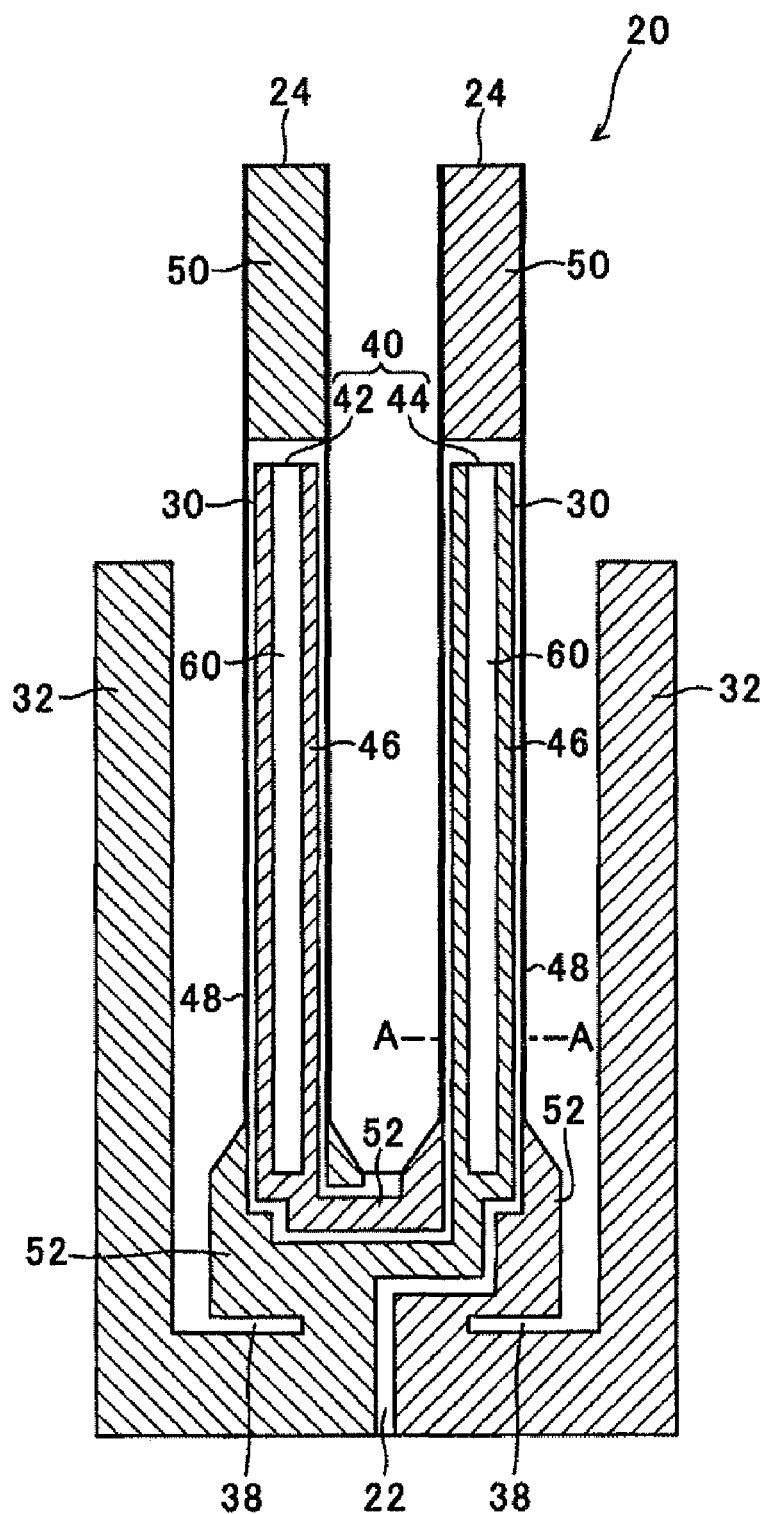
FIG. 1 is a schematic view illustrating a structure of a resonator element of a first embodiment of the invention.
Figure 2:
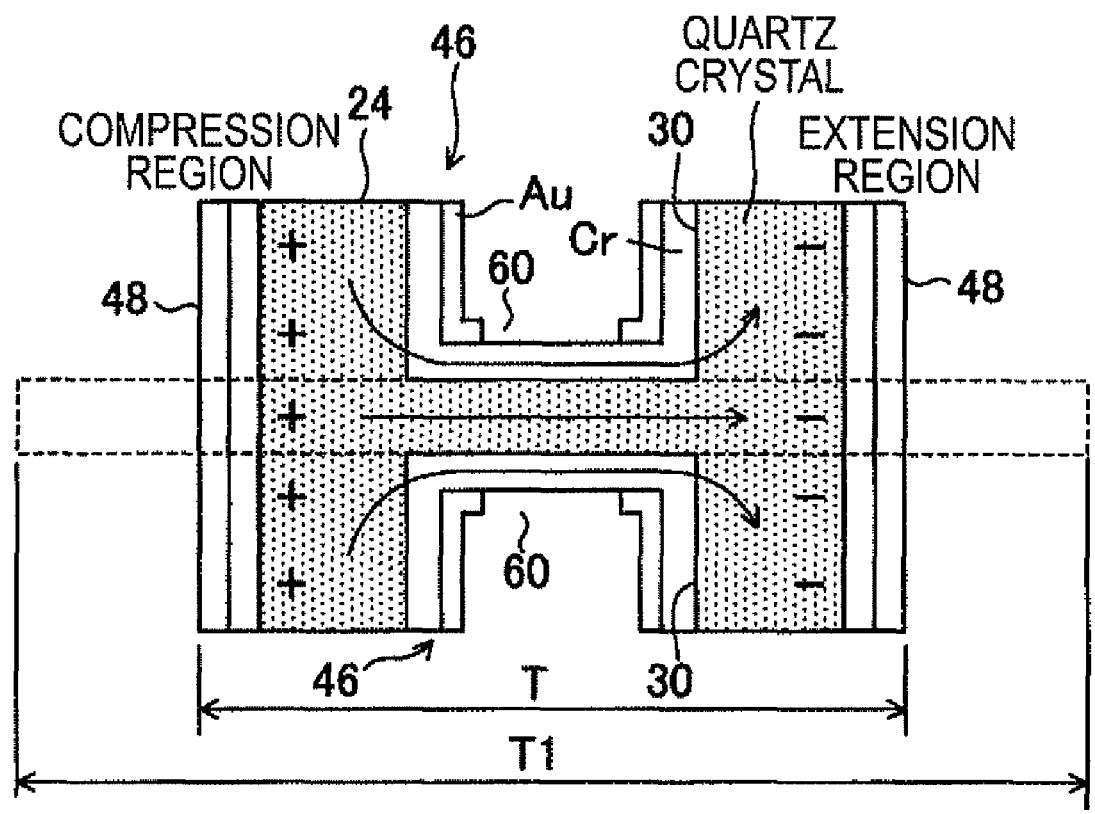
FIG. 2 is a cross sectional view of the resonator element taken along the line A-A of FIG. 1.

A resonator element and an oscillator of the invention are described below in detail with reference to the accompanying drawings. In the following embodiments, a tuning fork type piezoelectric resonator element is described as an example of the resonator element. The resonator element of the invention, however, is not limited to the tuning fork type piezoelectric resonator element. The invention can be applied to any resonator elements as long as they produce temperature increasing portions and temperature decreasing portions so as to be responded to each other when they are vibrated. The resonator element is not limited to a piezoelectric body. The vibration mode is also not limited to a flexural vibration mode. FIG. 1 is a schematic view illustrating a structure of a resonator element of a first embodiment of the invention. FIG. 2 is a cross sectional view taken along the line A-A of FIG. 1.

A resonator element 20 includes a base section 22, a pair of resonating arms 24 extending from the base section 22, and a pair of supporting arms 32, as shown in FIG. 1. In the first embodiment, the resonator element 20 is made of quartz crystal. Examples of the material for the resonator element 20 can include piezoelectric materials such as lithium tantalite, lithium niobate, and lead zirconium titanate, semiconductor materials such as silicon semiconductor, and insulative materials, in addition to quartz crystal.

The resonating arm 24 serving as a resonating body has a root portion at which it is connected to the base section 22. In the root portion, the width is widened toward a side adjacent to the base section 22. The resonating arm 24 is, thus, connected to the base section 12 with a large width, resulting in having high rigidity. As shown in FIG. 2, long grooves 30 are formed as a groove section on first and second surfaces of the resonating arm 24 in the long side direction of the resonating arm 24. The long groove 30 functions to reduce thermal elastic losses, enhancing the resonating arms being efficiently vibrated. As a result, electric field efficiency is improved, i.e., improvement of excitation efficiency, to lower a CI value.

The supporting arms 32 extend in a direction intersecting (e.g., perpendicular to) a direction in which the pair of resonating arms 24 extend from the base section 22. The supporting arms extend in opposite directions to each other and bend, and further extend in the extending direction of the pair of resonating arms 24. This bending allows the supporting arms 32 to be formed in compact. The supporting arms 32 function as portions attached to a package (not shown), for example. As a result of being attached with the support arms 32, the resonating arms 24 and the base section 22 come to be in a state of floating in the package. In the embodiment, the supporting arms 32 are disposed at the both sides of the two resonating arms 24 so as to sandwich them. The structure, however, is not limited to this. At least one of the supporting arms 32 may be disposed between the resonating arms 24.

The base section 22 has a pair of cut-in sections 38 formed in a direction so as to be faced to each other. The pair of cut-in sections 38 is formed to the base section 22 each at a location closer to the resonating arm 24 than a part to which the supporting arm 32 is connected. The cut-in sections 38 cancel out most of the vibrations of the resonating arms 24 being transmitted and suppress the vibrations from being transmitted to an outside through the base section 22 and the supporting arms 32 (vibration leak). As a result, an increase of a CI value can be prevented.

The resonating element 20 has an electrode 40 thereon. The electrode 40 includes a first electrode 42 and a second electrode 44. The first electrode 42 and the second electrode 44 are electrically isolated from each other in order to be coupled to different potentials. The electrode 40 is composed of two layers, for example. One is an under layer (e.g., a Cr layer) that has a high adhesiveness with a piezoelectric body, and the other formed on the under layer is a layer (e.g., an Au layer) that has a low electric resistance and is hardly oxidized.

Table. 1 shows thermal conductivities of film materials for forming the resonator element. Here, besides the electrode 40, other films, such as a protective film, and an adjustment film, and a driving material may be formed on the resonator element 20.

TABLE 1

| | Thermal conductivity [$Wm^{-1}K^{-1}$] |
|---|---|
| Quartz crystal Thermal conductivity in crystal X-axis direction or in crystal Y-axis direction | 6.2 |
| Quartz crystal Thermal conductivity in crystal Z-axis direction | 10.4 |
| Ag | 427 |
| Al | 237 |
| Au | 315 |
| C (diamond) | 1350 |
| Cr | 90 |
| Cu | 398 |
| Mo | 138 |
| Ni | 90 |
| Si | 148 |
| Ti | 70 |
| Pt | 20 |
| AlN | 285 |
| ZnO | 54 |

The film material of the invention has thermal conductivity higher than the thermal conductivities of quartz crystal used for the resonating body. The thermal conductivities of quartz crystal are: 6.2 $Wm^{-1}K^{-1}$ (in crystal X-axis direction or crystal Y-axis direction); and 10.4 $Wm^{-1}K^{-1}$ (in crystal Z-axis direction). Examples of the film material include Ag, Al, Au, C (diamond), Cr, Cu, Mo, Ni, Si, Ti, Pt, AlN, and ZnO. In a case where a number of films are layered on the surface of the resonator element 20, the films are formed in a manner such that an upper layer has thermal conductivity higher than that of the underlayer thereof. In a case where a material other than quartz crystal is used for the resonating body, a film material having thermal conductivity higher than that of the material is used for forming a film.

First exciting electrodes 46 are formed inside the long grooves 30 (at the inner side surfaces and the bottom surfaces) of each resonating arm 24. Specifically, the long grooves 30 are respectively formed on a first surface and a second surface (a front surface and a rear surface) of each resonating arm 24. A pair of the first exciting electrodes 46 is each formed inside one of the long grooves 30 back to back. The first exciting electrode 46 formed inside the long groove 30 at the first surface may be formed in a manner such that the first exciting electrode 46 extends on the first surface. The first exciting electrode 46 formed inside the long groove 30 at the second surface may be formed in a manner such that the first exciting electrode 46 extends on the second surface. The pair of the first exciting electrodes 46 is electrically coupled. The pair of the first exciting electrodes 46 formed on one resonating arm 24 is electrically coupled to second exciting electrodes 48 on the other resonating arm 24.

The second exciting electrodes 48 are formed on the side surfaces of each resonating arm 24. Specifically, a pair of the second exciting electrodes 48 is formed on both the side surfaces back to back of each resonating arm 24. The side surfaces are connected to the first and the second surfaces and formed in the thickness direction of the resonating arm 24 so as to face opposite directions. Each of the second exciting electrodes 48 may be formed in a manner such that the second exciting electrode 48 extends to on at least one of (or both) the first and the second surfaces. The pair of the second exciting electrodes 48 is electrically coupled to a connection electrode 50 formed on at least one of (or both) the first and the second surfaces at a portion (e.g., the end section), on which the long groove 30 is not formed, of the resonating arm 24.

The first excitation electrode 46 formed on one resonating arm 24 is electrically coupled to the second excitation electrode 48 formed on the other resonating arm 24 through a lead-out electrode 52 on the base section 22. The lead-out electrode 52 is formed up to the supporting arm 32 arranged adjacent to the resonating arm 24 where the second excitation electrode 48 is formed. The lead-out electrode 52 may be formed on the first and the second surfaces (or further on the side surfaces) of the resonating arm 32. In this case, the lead-out electrode 52 can serve as a part electrically coupled to an outside on the resonating arm 32. The first electrode 42 is composed of a set of the first exciting electrode 46, the second exciting electrode 48, the connection electrode 50, and the lead-out electrode 52 that are electrically coupled. Likewise, the second electrode 44 is composed of another set of the first exciting electrode 46, the second exciting electrode 48, the connection electrode 50, and the lead-out electrode 52 that are electrically coupled. Each resonating arm 24 includes the first electrode 42 and the second electrode 44. Applied a voltage between the first exciting electrode 46 and the second exciting electrode 48, the resonating arm 24 is vibrated since the side surfaces are expanded and contracted.

The first exciting electrode 46 formed inside the long groove 30 has a layered structure of Cr serving as a lower layer and Au serving as an upper layer as described above, in the embodiment. The first exciting electrode 46 includes a recessed section 60 in which an Au film of the upper layer is removed as shown in FIG. 2. It is advisable that the recessed section 60, while which is formed along the long groove 30 as shown in FIG. 1, is formed at least between a compression region and an extension region, i.e., at the root portion of the resonating arm 24. In a case where films are layered on the resonator element 20, the upper layer made of a material having high thermal conductivity is removed.

Here, the resonator element 20 of the invention aims to be used in a high frequency range in which thermal elastic loss is adiabatic. In the range, a relation of 1<fr/f0 is satisfied where fr is the mechanical resonance frequency of a resonating body and f0 is the thermal relaxation frequency of the resonating body alone. Here, the term "resonating body alone" means a resonating body on which metal films, such as electrodes, are thoroughly not provided. For example, quartz crystal is used as a material for a resonator element, the resonator body alone means a resonator made of using quartz crystal only, and having no materials provided thereon.

Here, it is also known that the relaxation frequency f0 can be obtained from the following formula.

$$f0 = \pi k/(2\rho C p a^2) \quad (1)$$

Here, π denotes circle ratio, k denotes a thermal conductivity in vibration direction of the resonating arm, ρ denotes a mass density of the resonating arm, Cp denotes a heat capacity of the resonating arm and a denotes a width of the resonating arm.

The resonator element 20 thus structured of the invention is electrically coupled to connection electrode of a package with the exciting electrodes and fixed. Applied a predetermined voltage to the exciting electrodes in this state, the resonating arms 24 vibrate to be closer to and apart from each other in a flexural vibration mode. The resonating arm 24 becomes a resonating body when it is vibrated. The resonating arm 24 includes a first region in which the resonating arm 24 receives a compression stress or an extension stress, and a second region in which the resonating arm 24 receives an extension stress when the first region receives the compression stress and a compression stress when the first region receives the extension stress.

The flexural vibration causes a compression stress and an extension stress to occur at the root portion of the resonating arms 24. When the resonating arms 24 bend to be closer to each other, a compression stress is applied to the inner sides (e.g., the first region) of the root portion while an extension stress is applied to the outer sides (e.g., the second region) of the root portion. Resulting mechanical strains cause a part to which the compression stress is applied to rise the temperature while a part to which the extension stress is applied to decrease the temperature. In contrast, when the resonating arms 24 bend to be apart from each other, an extension stress is applied to the inner sides of the root portion to decrease the temperature while a compression stress is applied to the outer sides to increase the temperature. In this way, there is a temperature gradient between the inner side and the outer side at the root portion of the resonating arm 24. The gradient is reversed between when the resonating arms 24 bend to be closer to each other and when they bend to be apart from each other.

In a case shown in FIG. 2, heat is transferred from the compression region to the extension region through the long groove 30 due to the temperature gradient. In this case, a heat transfer path from the compression region to the extension region is narrowed on the way by the long groove 30. As a result, a relaxation time τ, which is a period during which the temperatures of the compression region and the extension region come to an equilibrium state, comes to longer than a relaxation time τ0, which is the relaxation time of a structure having no long groove 30. Because above case can be considered as an equivalent case in which a width T of the long groove 30 is extended, along the width direction of the resonating arm 24, to a virtual width T1 shown in FIG. 2 with broken lines. Further, the first exciting electrode 46 formed inside the long groove 30 includes the recessed section 60 in the upper layer of Au in the embodiment. The recessed section 60, thus, cuts off the heat transfer path passing through Au having high thermal conductivity. This structure causes longer relaxation time, resulting in the relaxation frequency being lowered based on the equation of $fm = 1/2\pi \cdot \tau$.

Figure 8:
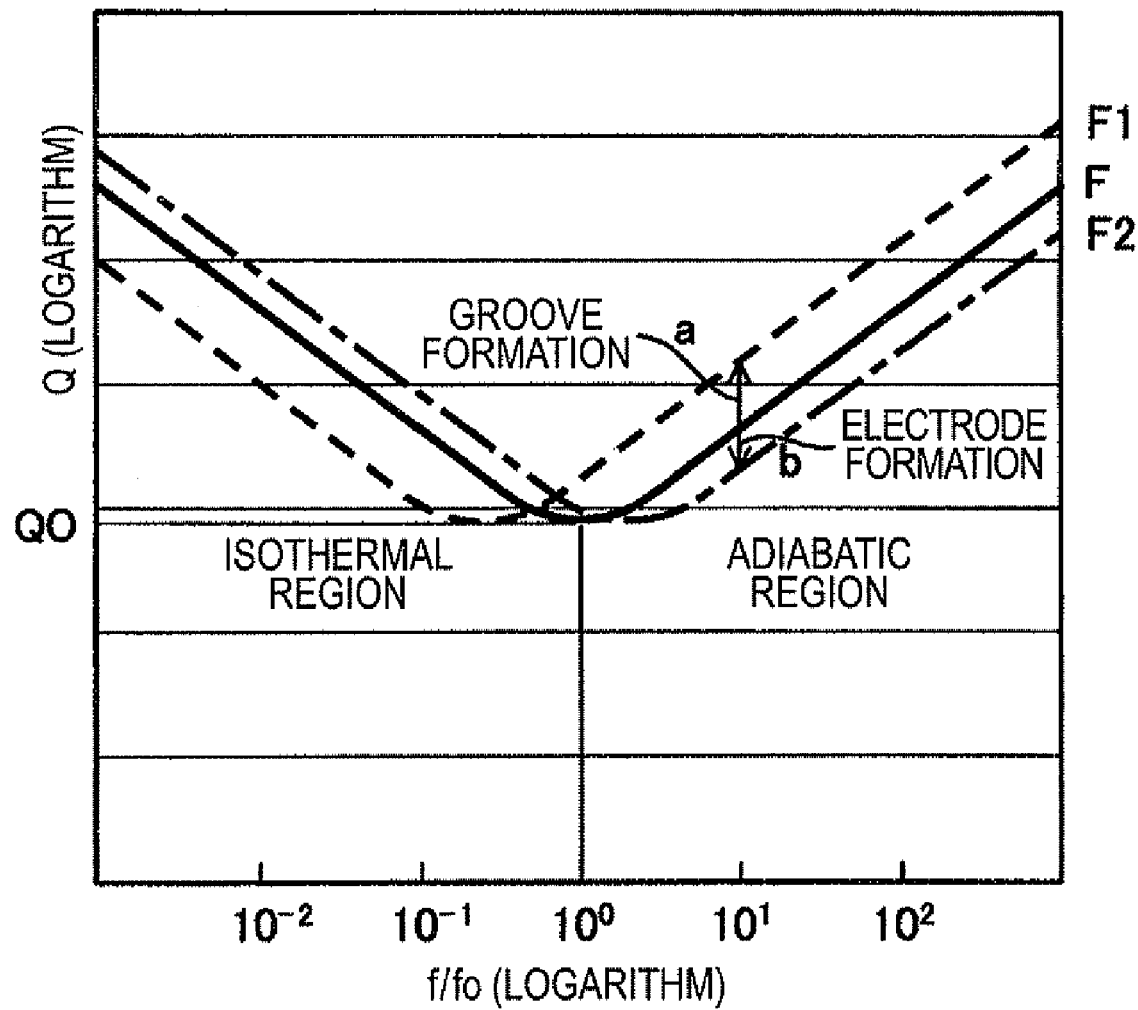
FIG. 8 shows a relation of a relaxation frequency and the minimum value of a Q value.
Figure 9A:
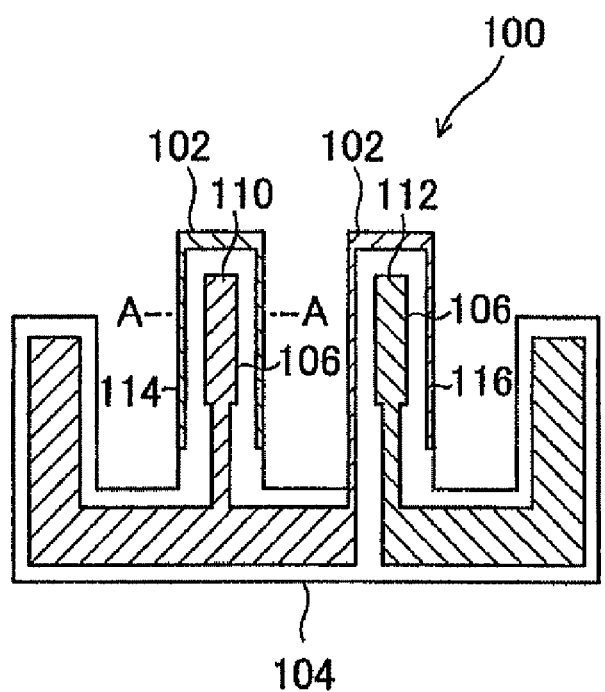
FIGS. 9A and 9B show schematic structures of a related art flexural resonator element.
Figure 9B:
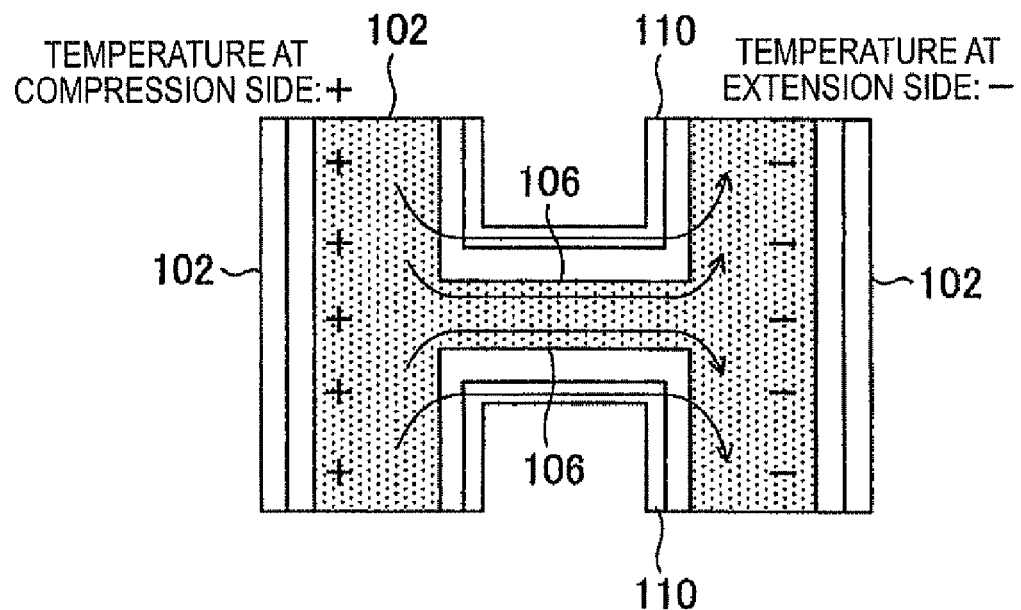

The lowering of the relaxation frequency is described based on FIG. 8 showing the relationship between a frequency and a Q value. In FIG. 8, the shape of the curve F is not changed, but the curve F is shifted to a position of the curve F1 in a lower frequency side, with the lowering of the relaxation frequency. Accordingly, if a desired use frequency is in the adiabatic region, the Q value is always higher than the minimum value Q0 in the conventional structure. As described above, the resonator element 20 of the embodiment enables the Q value to be set high to exhibit high performance by providing the recessed section 60 in the electrode inside the long groove 30 between the compression region (the first or the second region) and the extension region (the second region or the first region).

Figure 3:
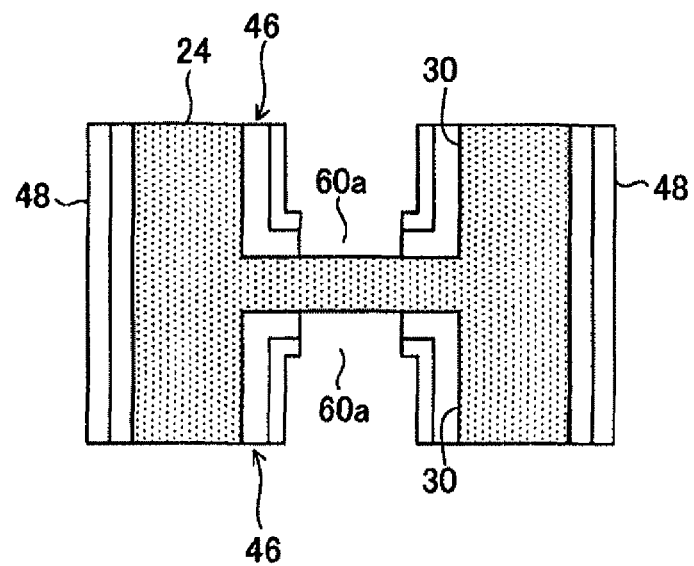
FIG. 3 is a cross sectional vies illustrating a featured part of a resonator element according to a second embodiment of the invention.

FIG. 3 is a cross sectional view illustrating a featured part of a resonator element according to a second embodiment of the invention. As shown in FIG. 3, the resonating arm 24 includes recessed sections 60*a* each in which the bottom surface of the long groove 30 is exposed, in the second embodiment. Specifically, the recessed section 60*a* is formed when the first exciting electrode 46 is formed inside the long groove 30 in a manner such that the electrode is not formed as being partially removed. The first exciting electrode 46 is formed by forming a Cr layer having a high adhesiveness with a piezoelectric body as a lower layer, followed by forming an Au layer that has a low electric resistance and is hardly oxidized as an upper layer. As a result, the resonating arm 24 appears at the bottom surface of the long groove 30. It is advisable that the recessed section 60*a* is formed along the long groove 30, or at least between a compression region and an extension region, i.e., at the root portion of the resonating arm 24.

In the resonator element of the second embodiment, the recessed section is provided to the film having thermal conductivity higher than that of the material of the resonating body so as to cut off the heat transfer path between the compression region and the extension region in the film. As a result, only the long groove 30 functions as the heat transfer path. Likewise the resonator element shown in FIGS. 1 and 2, this structure causes the relaxation time to lengthen, lowering the relaxation frequency. As a result, a high Q value can be attained.

Figure 4:
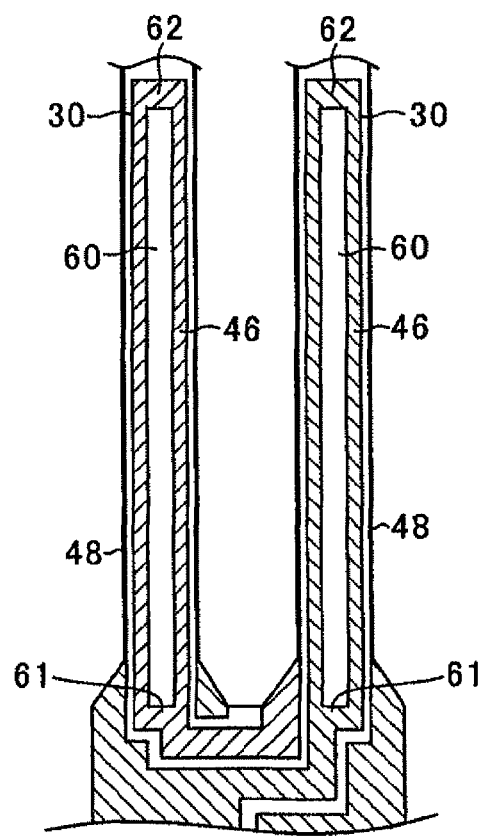
FIG. 4 is a cross sectional vies illustrating a featured part of a resonator element according to a third embodiment of the invention.

FIG. 4 is a plan view illustrating a featured part of a resonator element according to a third embodiment of the invention. As shown in FIG. 4, the resonating arm 24 of the third embodiment is structurally different from that of the first embodiment in that the first exciting electrode 46 formed inside the long groove 30 has an end section 62 in which the recessed section is not formed. Other structure is the same as that of the resonator element 20 of the first embodiment.

In the resonator element of the third embodiment, the first exciting electrode 46 is formed on the bottom surface, which corresponds to the end section 62, of the long groove 30 of the resonating arm 24, and the recessed section 60 is formed on the bottom surface, excluding the end section 62 and a root section 61, of the long groove 30. In a plan view of the long groove 30, the recessed section 60 is surrounded by the end section 62 and the root section 61.

The recessed section 60*a* of the second embodiment can be applied to the resonating arms of the third embodiment.

The resonator element of the third embodiment can lengthen the relaxation time since the recessed sections 60 are provided to the resonating arms 24. Further, the recessed section 60 is not formed, but the electrode is formed at the end section of the long groove 30. This structure can reduce ohmic losses (resistance losses) with assured electric conduction.

Figure 5A:
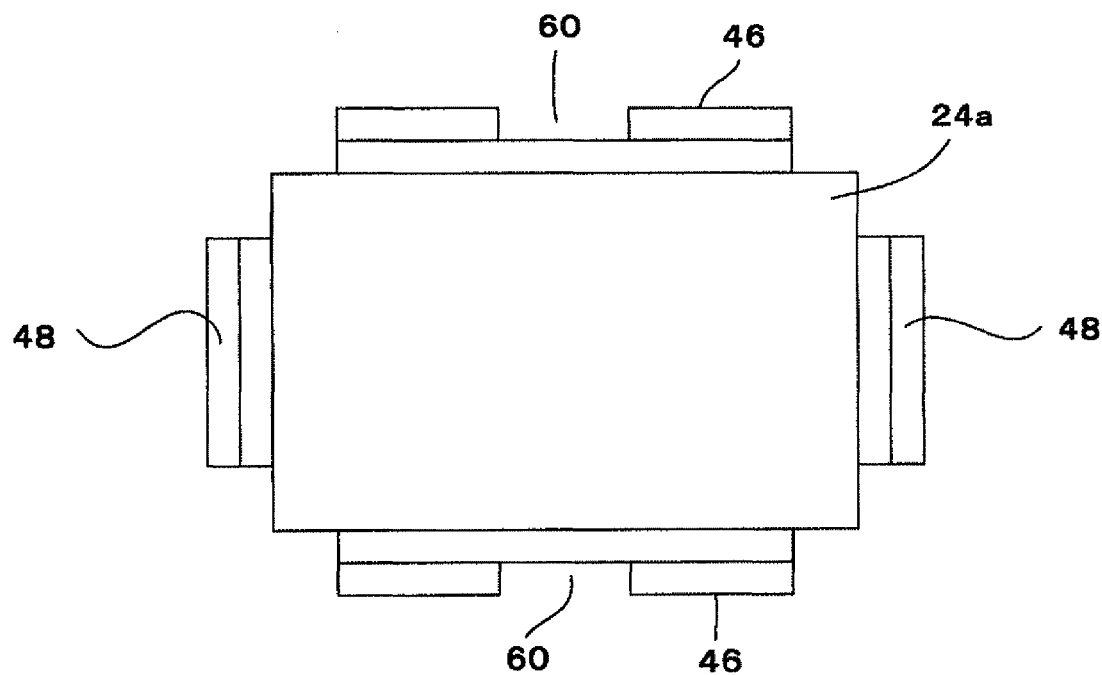
FIGS. 5A and 5B are cross sectional views illustrating a featured part of a resonator element according to a fourth embodiment of the invention.
Figure 5B:
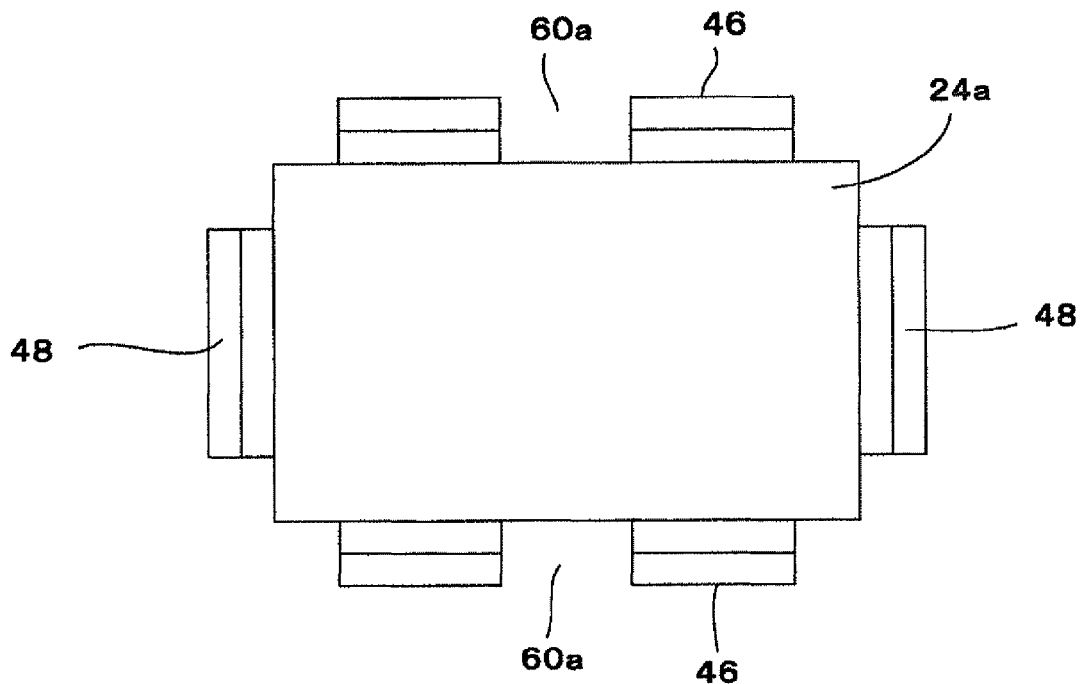

FIGS. 5A and 5B are cross sectional views illustrating a featured part of a resonator element according to a fourth embodiment of the invention. As shown in FIGS. 5A and 5B, a resonating arm 24*a* of the resonator element of the fourth embodiment has no long grooves.

The resonating arm 24*a* shown in FIG. 5A includes the recessed sections 60 in an Au layer serving as the upper layer. The recessed sections 60 are formed in the same manner of the first embodiment in the step of forming the first exciting electrodes 46 on the surfaces of the resonating body as films.

The resonating arm 24*a* shown in FIG. 5B includes the recessed sections 60*a* in which the upper and lower layers are removed. The recessed sections 60*a* are formed in the same manner of the second embodiment in the step of forming the first exciting electrodes 46 on the surfaces of the resonating body as films.

It is advisable that the recessed sections of the fourth embodiment are formed at least between a compression region and an extension region, i.e., at the root portion of the resonating arm 24*a*.

In the resonator element of the fourth embodiment, the recessed section is provided to the film having thermal conductivity higher than that of the material of the resonating body so as to cut off the heat transfer path between the compression region and the extension region in the film. As a result, only the long groove 30 functions as the heat transfer path. Likewise the resonator element shown in FIGS. 1 and 2, this structure causes the relaxation time to lengthen, lowering the relaxation frequency. As a result, a high Q value can be attained.

Figure 6:
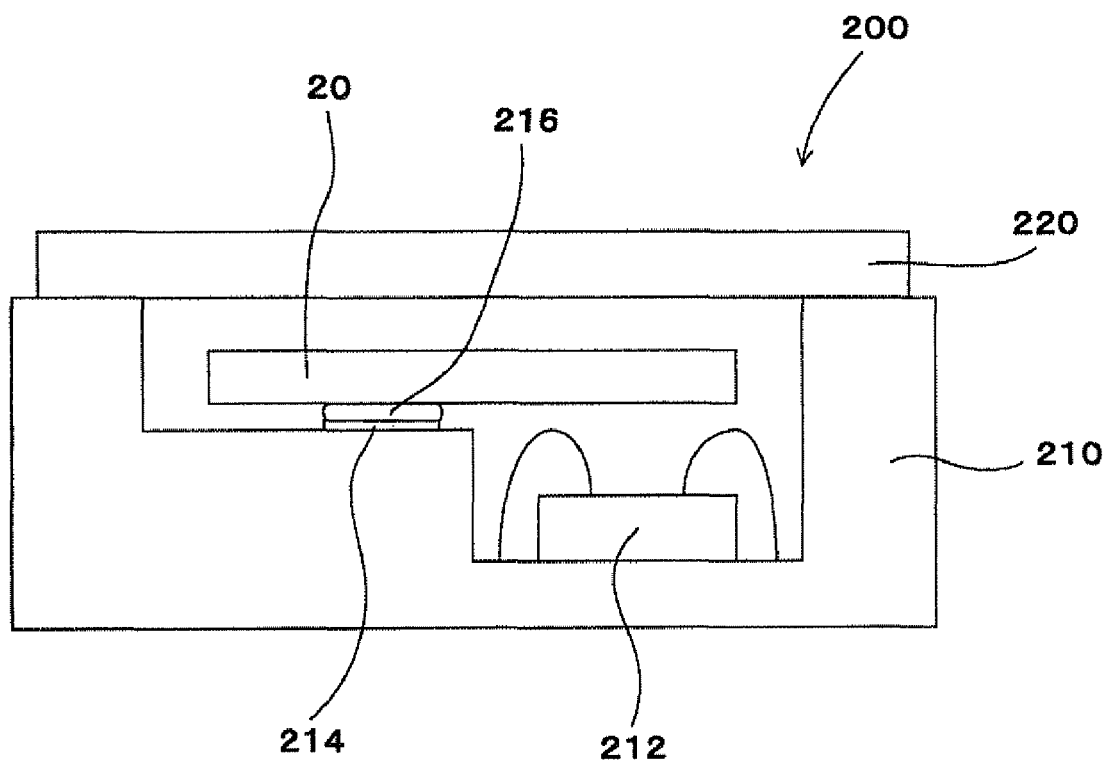
FIG. 6 shows an oscillator in which the resonator element of the invention is mounted.
Figure 7:
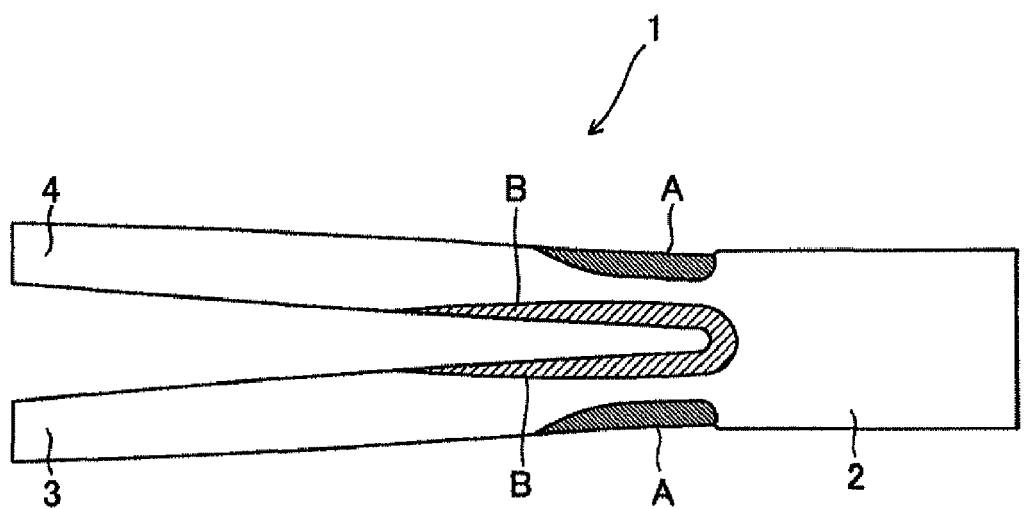
FIG. 7 is an explanatory view of thermal conduction of a piezoelectric resonator element.

FIG. 6 shows an oscillator in which the resonator element of the invention is mounted.

An oscillator 200 according to a fifth embodiment of the invention mainly includes the resonator element 20, an IC element 212, a package 210 housing the IC element 212 and the resonator element 20, and a lid 220 sealing an opening of the package 210.

The package 210 is box-shape-formed by layering and firing ceramic green sheets and the like, and has a cavity formed in a recessed shape. An inner mounting electrode 214 for mounting the resonating element 20 is formed in the cavity. The package 210 is provided with external mounting terminals on the outer bottom surface. The external mounting terminals are electrically coupled to the inner mounting electrode 214 through through-holes and the like (not shown).

The lid 220 seals the opening provided at the upper surface of the package 210. The lid 220 can be made of metal or glass.

The IC element 212 and the resonator element 20 are mounted to the package 210 thus structured. The IC element 212 is mounted by wire bonding. The resonator element 20 is mounted with a conductive adhesive 216. The lid 220 is bonded with a bonding member to seal the opening of the package 210 in which the IC element 21 and the resonator element 20 are mounted.

The oscillator thus structured can have a feature that the lowering of a Q value caused by a heat transfer is prevented.

The entire disclosure of Japanese Patent Application No. 2009-047641, filed Mar. 2, 2009 is expressly incorporated by reference herein.

What is claimed is:

1. A resonator element, comprising:
   a resonating body having a first region and a second region, the first region receiving a compression stress or an extension stress by a vibration, the second region receiving an extension stress responding to the compression stress in the first region, or a compression stress responding to the extension stress of the first region; and
   at least one film layer, on a surface of the resonating body between the first and the second regions, having thermal conductivity higher than thermal conductivity of the resonating body, wherein the film layer includes a recessed section, the recessed section being formed between first and second regions, in which at least one film layer is removed.

2. The resonator element according to claim 1, wherein the resonating body includes a groove section having the recessed section.

3. The resonator element according to claim 1, wherein the resonating body vibrates in a flexural vibration mode.

4. An oscillator comprising the resonator element according to claim 1.

* * * * *